United States Patent

Hinds

[15] 3,655,987

[45] Apr. 11, 1972

[54] MEANS FOR NOISE REDUCTION IN OUTPUT OF PHOTOEMISSIVE CELL COMPRISING PERIODICALLY DISCHARGED INTEGRATOR CAPACITOR

[72] Inventor: David Hinds, York, England

[73] Assignee: Vickers Limited, London, England

[22] Filed: May 26, 1970

[21] Appl. No.: 40,581

[30] Foreign Application Priority Data

July 17, 1969 Great Britain........................36,163/69

[52] U.S. Cl.................................250/206, 250/207, 250/214

[51] Int. Cl.................................................G01j, H01j 39/12

[58] Field of Search.......................250/206, 207, 214 P, 214

[56] References Cited

UNITED STATES PATENTS

| | | | |
|---|---|---|---|
| 1,973,512 | 9/1934 | Smith | 250/214 P |
| 2,386,320 | 10/1945 | Kott | 250/214 P |

*Primary Examiner*—James W. Lawrence
*Assistant Examiner*—T. N. Grigsby
*Attorney*—Pennie, Edmonds, Morton, Taylor and Adams

[57] ABSTRACT

An electrical circuit including a photoemissive cell and an integrator capacitor which receives current from the cell and which is repeatedly discharged, the output being amplified to produce an amplified representation of the photocurrent of the cell with reduced noise.

9 Claims, 6 Drawing Figures

Patented April 11, 1972

3,655,987

2 Sheets-Sheet 1

Inventor
David Hinds
By
Pennie, Edmonds, Morton, Taylor & Adams
Attorneys

Inventor
David Hinds
By
Fennie, Edmonds, Morton, Taylor & Adams
Attorneys

MEANS FOR NOISE REDUCTION IN OUTPUT OF PHOTOEMISSIVE CELL COMPRISING PERIODICALLY DISCHARGED INTEGRATOR CAPACITOR

The present invention relates to apparatus for and a method of reducing the effect of noise in a photoemissive cell.

Where a photoemissive cell, for example, a photomultiplier is used as the light detector in a photometric device, it is common practice to achieve further amplification of the detector current by feeding this current into a load resistance followed by a voltage amplifier, or directly into a current amplifier.

The noise present in the photo current often becomes a limiting factor in the design of photometric devices, limiting the useful amplification which can be achieved, for example at low light levels where a high degree of amplification is required, noise will overload the amplifier. Low-pass filters are often used in order to reduce the amplitude of noise generated at frequencies above the maximum of interest. For low output currents from the photodetector or where the cut-off frequency of the filter needs to be low, for example 1 Hz, the amplifier and filter design presents considerable difficulty.

According to one aspect of the present invention there is provided an electrical circuit comprising a photoemissive cell, amplification means for amplifying the output of the cell an integrator capacitor connected to the output of the cell and to the amplification means, and switching means for repeatedly discharging the integrator capacitor, whereby to reduce the effect of noise in the signal fed to the amplification means.

Figure 1:
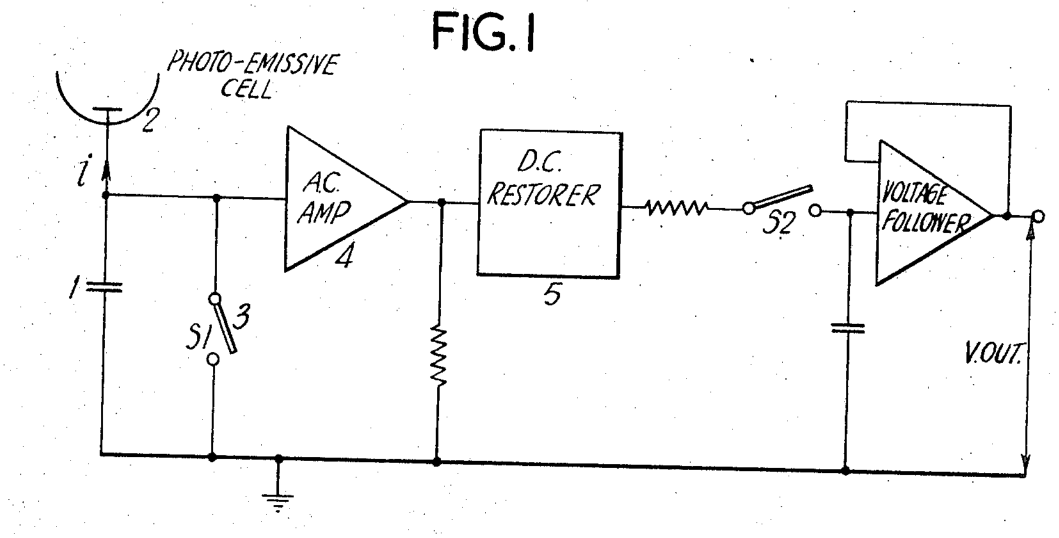
Figure 2A:
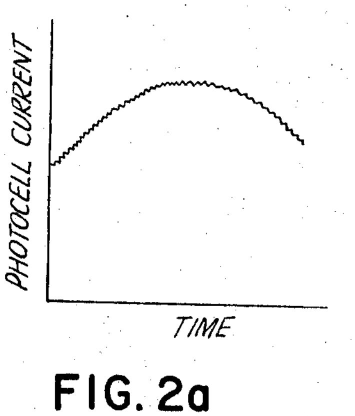
Figure 2C:
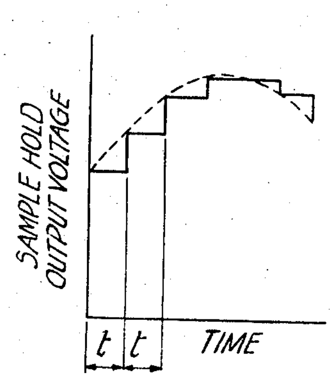
Figure 2B:
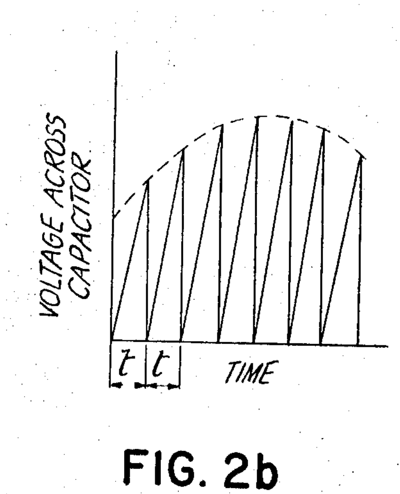
Figure 3:
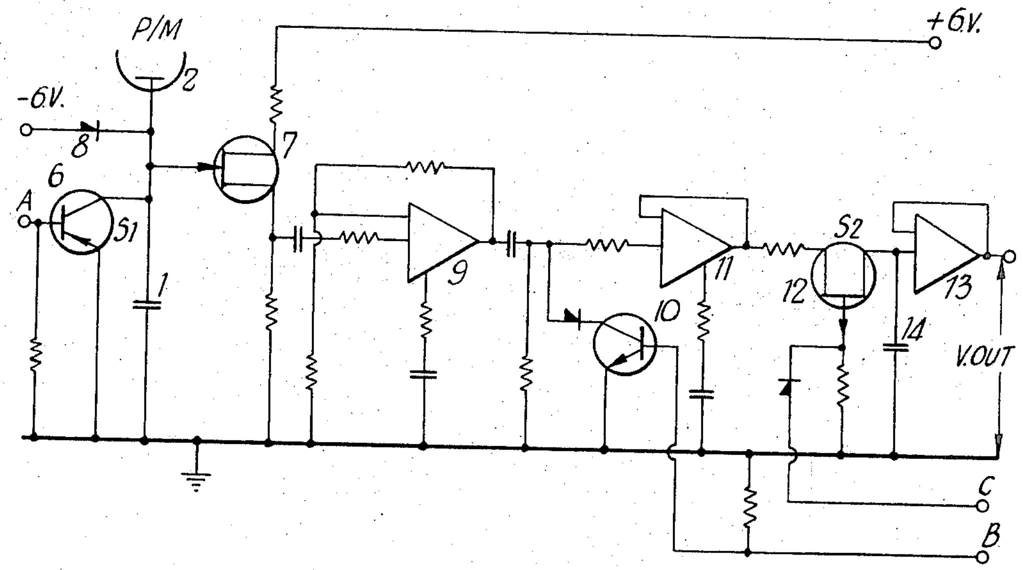
Figure 4:
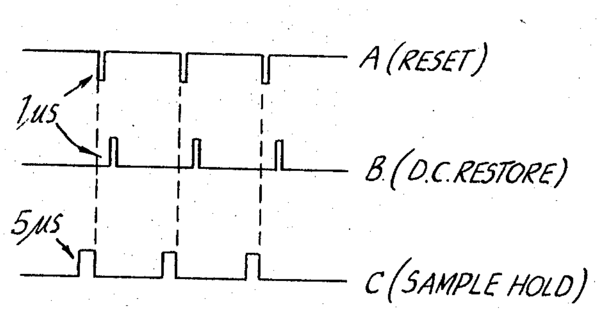

In order that the present invention may be more fully understood, two embodiments of the invention will now be described, by way of example, with reference to the accompanying informal drawings in which, FIG. 1 shows a block diagram or flow sheet of a system incorporating a photoemissive cell and an integrating capacitor connected to the cell, FIGS. 2*a*, 2*b*, and 2*c* respectively show the photocell current waveform, the voltage waveform across the capacitor and output voltage waveform for the block diagram shown in FIG. 1, FIG. 3 shows a flow sheet of a practical system equivalent to the system of FIG. 1, and FIG. 4 shows a diagram of the pulses involved in the flow sheet of FIG. 3.

Referring to FIG. 1, a capacitor 1 is charged by current from a photoemissive cell 2. The capacitor 1 is discharged at regular equal time intervals "*t*" by means of a switch 3. The photoemissive cell current waveform is shown in FIG. 2(*a*) and the voltage waveform across the capacitor 1 is shown in FIG. 2(*b*).

The voltage across the capacitor 1 is fed to an A.C. coupled amplifier 4 and the output from this amplifier is D.C. restored by a D.C. restorer 5. Alternatively, the A.C. coupled amplifier 4 and the D.C. restorer 5 may be replaced by a D.C. amplifier. In this way the original photoemissive cell current waveform can be recovered less the high frequency components, in the form of steps, by employing a known sample and hold technique. The stepped output waveform is shown in FIG. 2*c*.

Referring to FIG. 3 a practical system working on the above described principle is illustrated. The photoemissive cell 2 charges the integrating capacitor 1, The peak photomultiplier current is 100λA and the peak output voltage is 6 v. The capacitor 1 is discharged by a parallel connected transistor 6 which is switched on for a 1 μS period every 100 μS by a series of clock pulses A i.e. the out-off frequency is 10KHZ. The waveform shown in FIG. 2*b* across the capacitor 1 appears at the source of the field effect transistor 7. This transistor 7 is simply an impedance level changing device having a very high input impedance to ensure that the capacitor 1 is not discharged by parallel leakage. A catching diode 8 is provided which prevents excessive voltage being built up across the capacitor 1 which would damage the transistors 6 and 7.

The waveform shown in FIG. 2*b* is amplified by an operational amplifier 9 which has a voltage gain of 20. The output from the amplifier 9 is D.C. restored by means of a shunt synchronous demodulator transistor 10. A further operational amplifier 11 is provided. This amplifier 11 has unity gain and avoids loading the D.C. restorer by virtue of its high input impedance. The voltage waveform at the output of the amplifier 11 is then simply a magnified form of the voltage across the capacitor 1. This voltage waveform is fed to a second field effect transistor 12 which acts as a switch in series with a small resistor. This switch is normally open but when a sample hold pulse is applied the switch is closed. A capacitor 14 is connected in parallel with the switch and during the sample hold period this capacitor either charges or discharges to the level of the output of the amplifier 11. A further amplifier 13 which is simply a voltage follower like the applifier 11 follows the field effect transistor 12. This amplifier 13 has a high input impedance so that after one sample hold pulse has gone the capacitor 14 maintains its charge during the subsequent integration period until the next sample hold pulse arrives. The waveform across the capacitor 14 and at the output of the system is therefore as shown in FIG. 2*c*.

The above system enables a sharp cut-off low pass filter characteristic with readily controllable cut-off frequency to be obtained enabling optimum reduction of noise to be achieved. The filter characteristics can be extended to extremely low cut-off frequencies even under conditions of low photo detector currents, of the order of the dark current. The photo detector current is processed is such a way that further amplification can readily be performed by a simple low gain A.C. coupled amplifier with no stringent requirements with regard to noise performance since the input signal voltage level is high compared with that required in a conventional system.

What is claimed is:

1. An electrical circuit comprising
   a. a photoemissive cell,
   b. amplification means for amplifying the output of the cell,
   c. an integrator capacitor connected to the output of the cell and to the amplification means, and
   d. switching means for repeatedly discharging the integrator capacitor at predetermined equal time intervals, whereby to reduce the effect of noise in the signal fed to the amplification means.

2. An electrical circuit as claimed in claim 1, wherein the amplification means comprises a D.C. amplifier.

3. An electrical circuit as claimed in claim 1, wherein the amplification means comprises an A.C. coupled amplifier, and a D.C. restorer is connected to the A.C. amplifier.

4. An electrical circuit as claimed in claim 3, wherein the D.C. restorer comprises a shunt synchronous demodulator transistor.

5. An electrical circuit as claimed in claim 4, wherein the switching means comprises a transistor connected to a clock pulse generator operative to feed pulses to the transistor at fixed time intervals.

6. An electrical circuit as claimed in claim 1, wherein the output of the amplification means is connected to a sample and hold device.

7. A method of reducing the effect of noise in a photoemissive cell current including the steps of feeding the current to an integrator capacitor, repeatedly discharging the capacitor at predetermined equal time intervals and amplifying the signal produced.

8. A method as claimed in claim 7, wherein the integrator capacitor is discharged at fixed time intervals.

9. A method as claimed in claim 7, wherein the amplified signal is fed into a sample and hold device.

* * * * *